(12) United States Patent
Koyanagi et al.

(10) Patent No.: US 8,349,652 B2
(45) Date of Patent: Jan. 8, 2013

(54) METHOD AND APPARATUS FOR MANUFACTURING THREE-DIMENSIONAL INTEGRATED CIRCUIT

(75) Inventors: Mitsumasa Koyanagi, Sendai (JP); Takafumi Fukushima, Sendai (JP); Masahiko Sugiyama, Nirasaki (JP)

(73) Assignees: Tokyo Electron Limited, Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 13/258,664

(22) PCT Filed: Mar. 10, 2010

(86) PCT No.: PCT/JP2010/054031
§ 371 (c)(1),
(2), (4) Date: Oct. 11, 2011

(87) PCT Pub. No.: WO2010/110070
PCT Pub. Date: Sep. 30, 2010

(65) Prior Publication Data
US 2012/0021563 A1 Jan. 26, 2012

(30) Foreign Application Priority Data
Mar. 23, 2009 (JP) .................. 2009-070769

(51) Int. Cl.
*H01L 21/50* (2006.01)
(52) U.S. Cl. .............. 438/107; 156/578; 257/E21.499
(58) Field of Classification Search .............. 158/578; 257/E21.499; 438/107
See application file for complete search history.

(56) References Cited

U.S. PATENT DOCUMENTS

| | | | |
|---|---|---|---|
| 7,400,037 B2 * | 7/2008 | Yang et al. | 257/723 |
| 2003/0013230 A1 * | 1/2003 | Dudoff et al. | 438/107 |
| 2004/0154733 A1 | 8/2004 | Morf | |
| 2007/0298540 A1 * | 12/2007 | Tanabe et al. | 438/118 |
| 2009/0023243 A1 | 1/2009 | Koyanagi | |
| 2009/0137084 A1 * | 5/2009 | Kida | 438/107 |
| 2012/0061848 A1 * | 3/2012 | Blackshear | 257/774 |

FOREIGN PATENT DOCUMENTS

| | | |
|---|---|---|
| JP | 06-163634 A | 6/1994 |
| JP | 2001-332710 A | 11/2001 |
| JP | 2004-537158 A | 12/2004 |
| WO | 2006/077739 A1 | 7/2006 |

OTHER PUBLICATIONS

International Search Report for PCT/JP2010/054031 dated May 18, 2010.

* cited by examiner

*Primary Examiner* — Asok Kumar Sarkar
(74) *Attorney, Agent, or Firm* — Pearne & Gordon LLP

(57) ABSTRACT

There is provided a three-dimensional integrated circuit manufacturing method for temporarily attaching a chip to a transcription substrate, and securely detaching the chip from the transcription substrate when the chip is transferred to a supporting substrate. When a chip is temporarily attached to a transcription substrate, by evaporating a liquid existing between the chip and the transcription substrate, the solids of the chip and the transcription substrate can be attached to each other. Accordingly, the chip can be temporarily attached to the transcription substrate so as not to be deviated from its own position. Further, by setting adhesive strength between the chip and a supporting substrate to be higher than that between the chip and the transcription substrate, the chip can be securely detached from the transcription substrate when the chip is transferred from the transcription substrate to the supporting substrate.

11 Claims, 12 Drawing Sheets

METHOD AND APPARATUS FOR MANUFACTURING THREE-DIMENSIONAL INTEGRATED CIRCUIT

CROSS-REFERENCE TO RELATED APPLICATION

This Application is a U.S. national phase application under 35 U.S.C. §371 of PCT Application No. PCT/JP2010/054031 filed on Mar. 10, 2010, which claims the benefit of Japanese Patent Application No. 2009-070769 filed on Mar. 23, 2009, the entire disclosures of which are incorporated herein by reference.

TECHNICAL FIELD

The present invention relates to a method and apparatus for manufacturing a three-dimensional integrated circuit in which chips are stacked on a supporting substrate.

BACKGROUND ART

Regarding an integration density of an integrated circuit, Moore's law has been well known. Moore's law describes that an integration density doubles approximately every year. This Moore's law has been supported by development in a semiconductor micro processing technique. However, since the micro processing technique has reached a nano level, it is difficult to develop the micro processing technique at the same pace as it has been. For this reason, it has been said that Moore's law will reach its limit in the next generation or the generation after. As it is difficult to develop the micro processing technique, attention is drawn to a three-dimensional integrated circuit.

As depicted in FIG. 1A, a conventional system LSI1 is a two-dimensional integrated circuit in which functional blocks 3 such as a micro processer, a logic circuit, various memories, an input/output interface circuit or a communication controlling circuit is placed on a single chip 2. In comparison, as depicted in FIG. 1B, in a three-dimensional integrated circuit 4, the functional blocks 3 of the system LSI1 are divided and stacked in a three-dimensional manner. When the functional blocks 3 are stacked, a chip 5 of each layer has a thickness in the range of, for example, several μm to several hundreds μm. This three-dimensional integrated circuit has various advantages capable of reducing a length of a wiring, capable of densifying components, capable of increasing a signal processing rate, and capable of reducing power consumption. The three-dimensional integrated circuit has already been applied to a CMOS image sensor and will be applied to an integrated circuit such as a NAND, a DRAM or a logic circuit.

As a technique for implementing a three-dimensional integrated circuit, a method of alternately repeating a FEOL (Front End Of Line) process and a BEOL (Back End Of Line) process on a wafer, a method of stacking a chip on another chip (hereinafter, referred to as "Chip on Chip method"), a method of attaching and stacking wafers (hereinafter, referred to as "Wafer on Wafer method"), and a method of stacking multiple chips on a wafer (hereinafter, referred to as "Chip on Wafer method") have been known.

In the method of alternately repeating the FEOL process and the BEOL process, the FEOL process in which components such as a transistor are formed on a wafer and the BEOL process in which the formed components are connected to each other by wiring are repeated alternately. By repeating these processes, a three-dimensional integrated circuit can be formed on the wafer. However, there is a procedural problem in this method. That is, it is difficult to perform the FEOL process after the BEOL process. Further, if a defect arises in any one of the repeated FEOL process and BEOL process, the whole product becomes defective, resulting in a decrease in production yield.

In the Chip on Chip method, a chip cut from a wafer is stacked onto another chip without using a wafer. Only a high-quality chip called as "KGD (Known Good Die)" can be stacked, and, thus, production yield can be increased. The KGD refers to a die (i.e. chip) whose characteristics and reliability are verified. However, since this method is performed in a chip-level, there is a problem that a manufacturing throughput is greatly decreased.

In the Wafer on Wafer method, wafers having thereon components are stacked in a wafer-level. That is, a process can be performed in a wafer size level, and, thus, a throughput can be increased. However, since the wafer may include a defective chip (a chip yield from a wafer is not 100%), if the wafers are getting stacked more, a probability of producing defective products becomes higher. As a result, a production yield is decreased.

In the Chip on Wafer method, a chip is placed on a wafer and another chip is stacked onto the chip on the wafer. Finally, numerous three-dimensional integrated circuits are formed on the wafer. In the same manner as the Chip on Chip method, only a high-quality chip can be stacked, and, thus, a production yield can be increased. Further, it is possible to increase a throughput by using a wafer as compared with the Chip on Chip method. However, it requires that a robot picks thousands of chips one by one and positions each chip on the wafer. Therefore, the throughput is not much increased. Further, when each chip is mechanically positioned, the positioning accuracy is about 1 μm at most, and, thus, the positioning accuracy cannot be increased further.

In order to solve the problem of the Chip on Wafer method, the present inventors have suggested a method of manufacturing a three-dimensional integrated circuit for positioning a chip on a supporting substrate by using a self-organizing function (see Patent Document 1). In this manufacturing method of a three-dimensional integrated circuit, numerous chips are automatically positioned on a transcription substrate by using surface tension of water. Further, the transcription substrate to which the numerous chips are temporarily attached is reversed, and the numerous chips are collectively transferred from the transcription substrate to the supporting substrate.

To be specific, as depicted in FIG. 2, a water film 8 inflated in a convex shape by the surface tension is formed on a rear surface of a chip 6 (S1). Further, the water film 8 inflated in a convex shape by the surface tension is also formed at a temporary attachment area 7a of a transcription substrate 7 (S1). Subsequently, the chip 6 is mounted on the temporary attachment area 7a of the transcription substrate 7 with a rough positioning accuracy by using a chip bonder (S2). Then, the chip 6 is automatically positioned on the temporary attachment area 7a of the transcription substrate 7 by the surface tension of water (S3). Thereafter, the chip 6 is pressed onto the transcription substrate 7 by using a pressing plate 9. Thus, water exists at a minute gap between the chip 6 and the transcription substrate 7 and, at the same time, unnecessary water is removed (S4). The chip 6 is temporarily attached to the transcription substrate 7 by attracting force of the water existing at the gap between the chip 6 and the transcription substrate 7. Subsequently, the transcription substrate 7 to which numerous chips 6 are temporarily attached is reversed (S5). At this time, the chip 6 is temporarily attached to the transcription substrate 7 by the attracting force of water. Then, the transcription substrate 7 is moved toward a supporting substrate 10 and the chip 6 is finally attached to the supporting substrate 10 (S6). When the chip 6 is finally attached to the supporting substrate 10, the water between the chip 6 and the transcription substrate 7 is vaporized by heating the chip 6. Accordingly, the numerous chips 6 are detached from the transcription substrate 7 (S7). As described above, the chips 6 temporarily attached to the transcription substrate 7 can be transferred and finally attached to the supporting substrate 10.

Patent Document 1: PCT Publication No. WO2006/77739 (see paragraphs [0149] to [0164])

DISCLOSURE OF THE INVENTION

Problems to be Solved by the Invention

In the method of manufacturing a three-dimensional integrated circuit by using a self-organizing function, if numerous chips are accurately positioned on a transcription substrate, the transcription substrate can serve as a wafer in the Wafer on Wafer method and a process can be performed in a wafer size level. For this reason, a throughput can be increased in the same manner as the Wafer on Wafer method. In contrast, if numerous chips are not accurately positioned on a transcription substrate, the transcription substrate cannot serve as a wafer in the Wafer on Wafer method. For this reason, when the chips are temporarily attached to the transcription substrate, they need to be attached so as not to deviate from their own positions.

However, in the method of manufacturing a three-dimensional integrated circuit, the chip and the transcription substrate are temporarily attached to each other by attracting force of the water existing at a gap therebetween. The attracting force of water is not sufficient to securely attach the chip to the transcription substrate. By way of example, when the transcription substrate is reversed or transferred, there is a possibility that the chip accurately positioned on the transcription substrate may be deviated from its own position. In contrast, if the chip is too firmly attached to the transcription substrate, when the chip is transferred to the supporting substrate, the chip cannot be detached from the transcription substrate.

Thus, the present invention provides a three-dimensional integrated circuit manufacturing method and an apparatus capable of temporarily attaching a chip to a transcription substrate so as not to be deviated from its own position, and securely detaching the chip from the transcription substrate when the chip is transferred to a supporting substrate.

Means for Solving the Problems

In order to solve the above-described problems, in accordance with one aspect of the present invention, there is provided a method for manufacturing a three-dimensional integrated circuit by stacking a chip on a supporting substrate. The three-dimensional integrated circuit manufacturing method includes coating a plurality of temporary attachment areas formed on a transcription substrate with a liquid; releasing a plurality of chips onto a plurality of liquid drops divided by each of the temporary attachment areas and positioning each of the chips at each of the temporary attachment areas by using surface tension of the liquid; temporarily attaching each of the chips to each of the temporary attachment areas by evaporating the liquid between each of the chips and each of the temporary attachment areas; moving the transcription substrate to which the chips are temporarily attached toward the supporting substrate, and finally attaching the chips' surfaces opposite to surfaces temporarily attached to the transcription substrate to a plurality of final attachment areas of the supporting substrate or to a plurality of stacked chips on the final attachment areas such that adhesive strength between each of the chips and the supporting substrate or between each of the chips and each of the stacked chips on the supporting substrate is greater than adhesive strength between each of the chips and the transcription substrate; and detaching the chips from the transcription substrate by moving the transcription substrate away from the supporting substrate while the chips are attached to the supporting substrate or the stacked chips on the supporting substrate.

In accordance with another aspect of the present invention, there is provided an apparatus for manufacturing a three-dimensional integrated circuit by stacking a chip on a supporting substrate. The three-dimensional integrated circuit includes a transcription substrate on which a plurality of temporary attachment areas are formed, and a liquid coating device for coating the temporary attachment areas formed on the transcription substrate with a liquid. A plurality of chips are released onto a plurality of liquid drops divided by each of the temporary attachment areas and each of the chips is positioned at each of the temporary attachment areas by surface tension of the liquid; each of the chips is temporarily attached to each of the temporary attachment areas by evaporating the liquid between each of the chips and each of the temporary attachment areas; the transcription substrate to which the chips are temporarily attached is moved toward the supporting substrate, and the chips' surfaces opposite to surfaces temporarily attached to the transcription substrate are finally attached to a plurality of final attachment areas of the supporting substrate or a plurality of stacked chips on the final attachment areas such that adhesive strength between each of the chips and the supporting substrate or between each of the chips and each of the stacked chips on the supporting substrate is greater than adhesive strength between each of the chips and the transcription substrate; and the chips are detached from the transcription substrate by moving the transcription substrate away from the supporting substrate while the chips are attached to the supporting substrate or the stacked chips on the supporting substrate.

Effect of the Invention

When a chip is temporarily attached to a transcription substrate, by evaporating a liquid existing between the chip and the transcription substrate, the solids of the chip and the transcription substrate can be attached to each other. For this reason, the chip can be temporarily attached to the transcription substrate so as not to be deviated from its own position. Further, by setting adhesive strength between the chip and a supporting substrate (or stacked chip) to be higher than adhesive strength between the chip and the transcription substrate, the chip can be securely detached from the transcription substrate when the chip is transferred from the transcription substrate to the supporting substrate (or stacked chip).

BEST MODE FOR CARRYING OUT THE INVENTION

Hereinafter, a method of manufacturing a three-dimensional integrated circuit in accordance with an embodiment of the present invention will be described in detail with reference to the accompanying drawings. On a supporting substrate constituting a three-dimensional integrated circuit, chips are stacked in a vertical direction. The chips stacked on the supporting substrate will be explained first. An IC such as a micro processor and a logic circuit is formed on a chip. In order to electrically connect multiple chips stacked in a vertical direction, a TSV (Through Silicon Via) is formed in the chip.

Figures 1A, 1B:
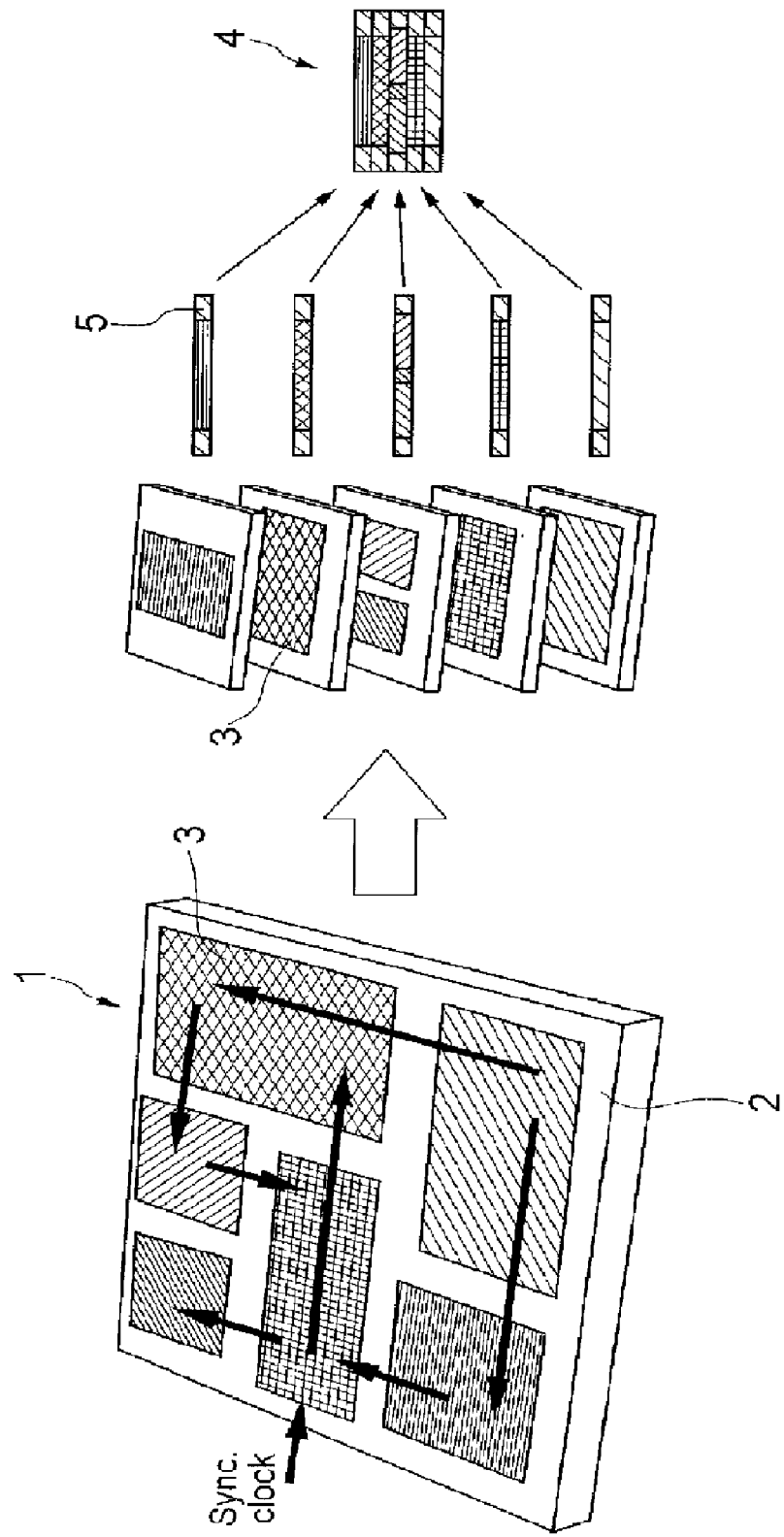
FIGS. 1A and 1B are comparative views of a two-dimensional integrated circuit and a three-dimensional integrated circuit (FIG. 1A illustrates a two-dimensional integrated circuit and FIG. 1B illustrates a three-dimensional integrated circuit).
Figure 2:
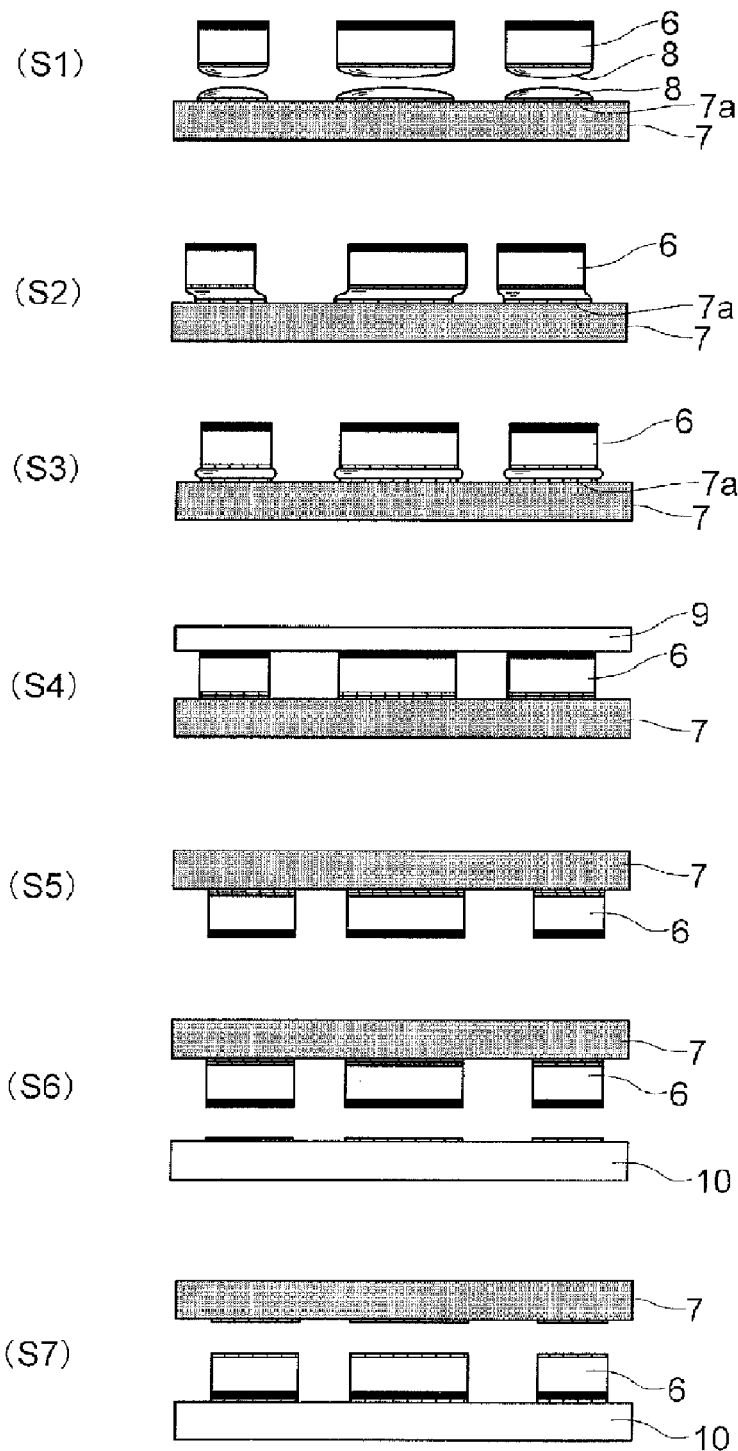
FIG. 2 is a process diagram showing a conventional method of manufacturing a three-dimensional integrated circuit.
Figure 3A:
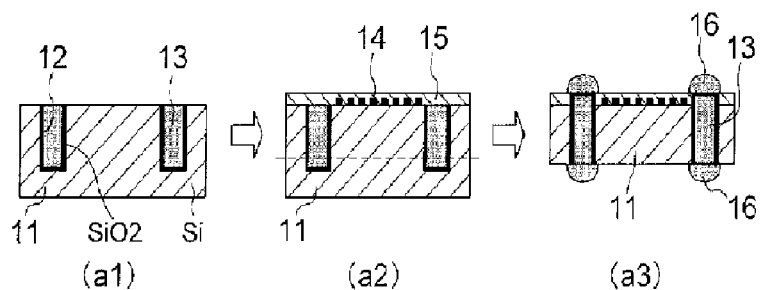
FIG. 3A to 3C show processes of forming a TSV on a chip of the present invention (FIG. 3A shows a Via First method, FIG. 3B shows a Via Last (front) method, and FIG. 3C shows a Via Last (back) method).
Figure 3B:
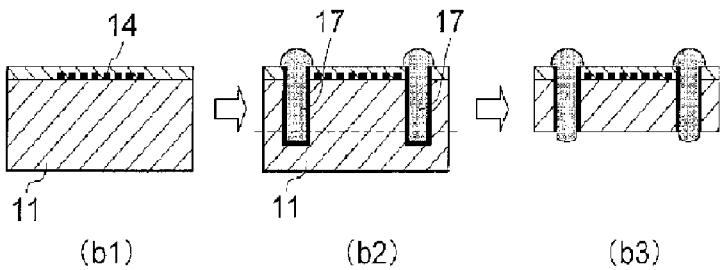
Figure 3C:
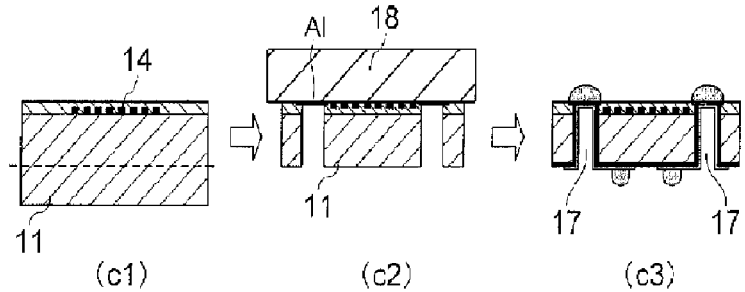

As depicted in FIG. 3A to 3C, processes of forming a TSV in a chip can be classified into three methods: a Via First method depicted in FIG. 3A; a Via Last (front) method depicted in FIG. 3B; and a Via Last (back) method depicted in FIG. 3C.

As depicted in FIG. 3A, in the Via First method, a TSV may be formed before a pre-process of manufacturing an IC is performed. Above all, within a silicon substrate 11, a trench 12 may be formed in a surface of the silicon substrate 11 (a1). An inner wall surface of the trench 12 is covered with a $SiO_2$ film as an insulating film. The trench 12 may be formed without penetrating the silicon substrate 11. The trench 12 may be filled with a conductive material such as polysilicon and tungsten so as to form a conductive plug 13 (a1). Then, on or within the silicon substrate 11, a semiconductor device such as a CMOS or an integrated circuit 14 may be formed (a2). Subsequently, a front surface of the silicon substrate 11 having thereon the semiconductor device or the integrated circuit 14 may be covered with a $SiO_2$ film 15 as an insulating film (a2). Finally, the silicon substrate 11 may be removed from its rear surface so as to expose the conductive plug 13 to the rear surface of the silicon substrate 11 (a3). On the front surface of the silicon substrate 11, a bump electrode 16 may be formed so as to be connected to the conductive plug 13 (a3).

As depicted in FIG. 3B, in the Via Last (front) method, a semiconductor device or an integrated circuit 14 may be first formed on or within a silicon substrate 11 (b1) and then, a TSV 17 may be formed (b2 and b3). In terms of a sequence of forming the TSV 17, the Via Last (front) method is different from the Via First method. In this method, the TSV 17 may be formed from a front surface of the silicon substrate 11 (b2). Also, in this method, a part of the silicon substrate 11 may be removed (b3).

As depicted in FIG. 3C, in the Via Last (back) method, a semiconductor device or an integrated circuit 14 may be first formed on or within a silicon substrate 11 (c1) in the same manner as the Via Last (front) method. A Part of the silicon substrate 11 may be removed and the silicon substrate 11 may be attached to a glass substrate 18. Then, a TSV 17 may be formed from a rear surface of the silicon substrate 11 (c2 and c3). Whether the TSV 17 is formed from the front surface of the silicon substrate 11 or from the rear surface thereof is different between the Via Last (back) method and the Via Last (front) method.

Figure 4:
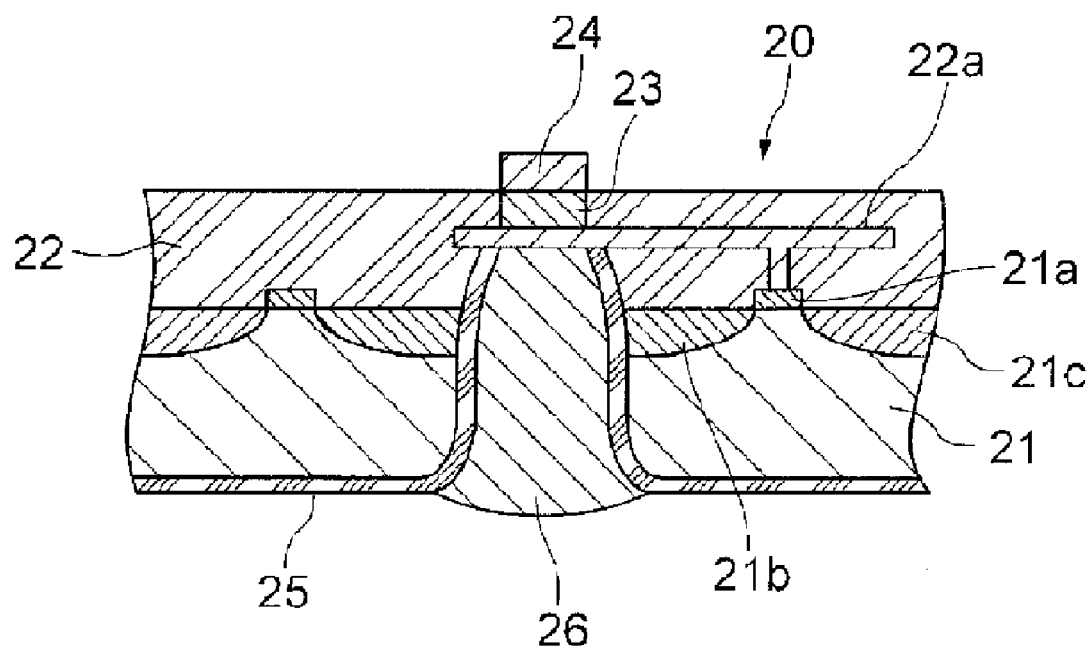
FIG. 4 is a cross-sectional view of a chip for a three-dimensional integrated circuit of the present invention.

FIG. 4 shows an example of a cross-sectional view of a chip 20. A gate electrode 21a may be formed on a silicon substrate 21, and a source region 21b and a drain region 21c may be formed at both sides of the gate electrode 21a. Further, on the silicon substrate 21, an insulating layer 22 made of $SiO_2$ may be formed so as to bury the gate electrode 21a. On a front surface portion of the insulating layer 22, wiring layers 24 (bump electrodes) made of nickel or gold may be formed. Within the insulating layer 22, an additional wiring layer 23 made of aluminum or the like may be formed, and the gate electrode 21a may be electrically connected to the wiring layers 23 and 24. Further, a via reaching an additional wiring layer 22a may be formed in the silicon substrate 21 and the insulating layer 22. An insulating layer 25 made of a $SiO_2$ film may be formed so as to cover a side wall of the via. Furthermore, a conductive plug 26 electrically connected to the additional wiring layer 22a may be formed via the insulating layer 25.

A size of the chip 20 used in a three-dimensional integrated circuit may vary depending on a purpose of a CMOS, a memory or the like and may be, for example, 5 mm×5 mm or 10 mm×10 mm. A thickness of the chip 20 may be in the range of, for example, from about 20 μm to about 100 μm. A diameter of the TSV may be in the range of, for example, from about 0.5 μm to about 100 μm.

Figure 5:
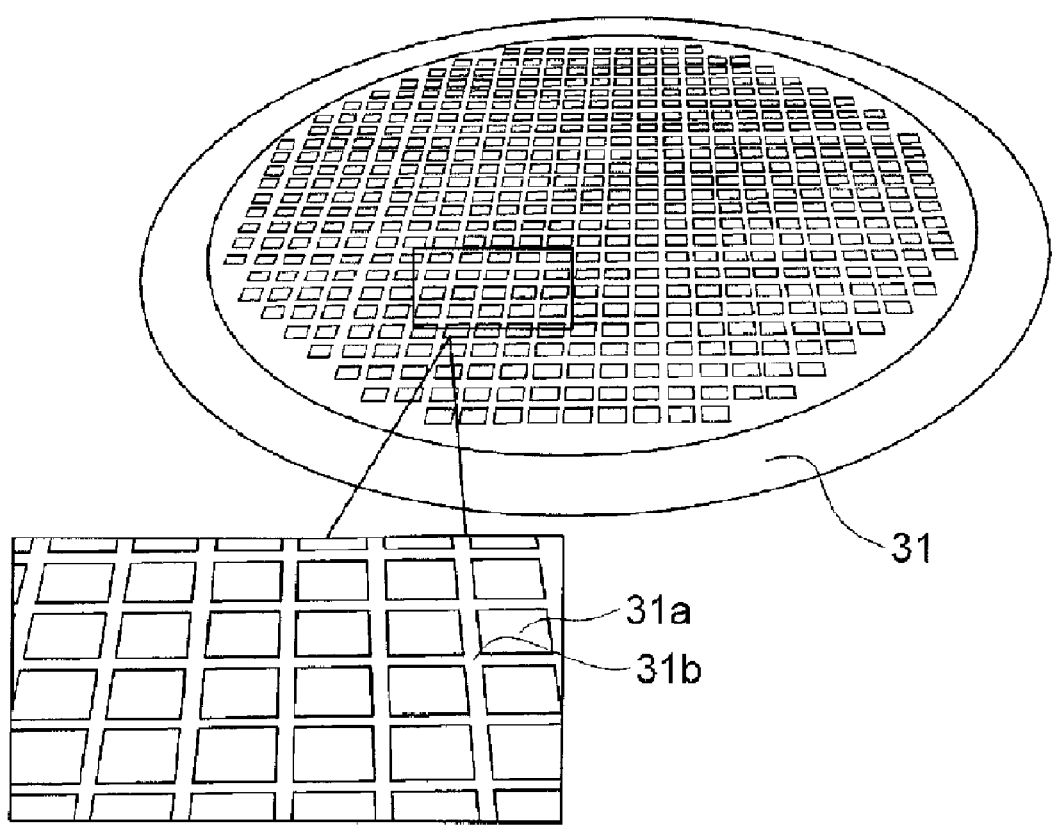
FIG. 5 is a perspective view of a carrier substrate of the present invention.

FIG. 5 provides a perspective view of a carrier substrate 31 as a transcription substrate to which numerous chips 20 are temporarily attached. The numerous chips 20 may be positioned and temporarily attached to the carrier substrate 21 and then transcribed onto a supporting substrate. On a front surface of the carrier substrate 31, there may be formed multiple temporary attachment areas 31a to arrange the numerous chips 20 in a layout that is a mirror image of a certain layout. A single chip 20 may be temporarily attached to a single temporary attachment area 31a. As the carrier substrate 31, a semiconductor wafer made of silicon or a glass substrate may be used. An insulating member or a conductive member may be used as the carrier substrate 31, if it is strong enough to hold the numerous chips 20.

The temporary attachment area 31a may be formed into a rectangular shape. A size and shape of the temporary attachment area 31a may be approximately the same as a size and shape of the chip 20 temporarily attached thereto. The temporary attachment area 31a may be defined by a hydrophilic film having a hydrophilic property. The hydrophilic film may be formed of, for example, $SiO_2$, $Si_3N_4$, a double-layer film of aluminum and alumina ($Al/Al_2O_3$), or a double-layer film of tantalum and tantalum oxide ($Ta/Ta_2O_5$).

The temporary attachment area 31a may be surrounded by a hydrophobic film or hydrophobic material 31b formed in a grid pattern. As the hydrophobic film or hydrophobic material 31b, a material having a property of repelling water such as single-crystalline silicon, polycrystalline silicon, amorphous silicon, fluorine resin, silicon resin, Teflon (registered trademark) resin, polyimide resin, resist, wax or BCB (Benzo-Cyclo-Buten) may be used.

Figure 6:
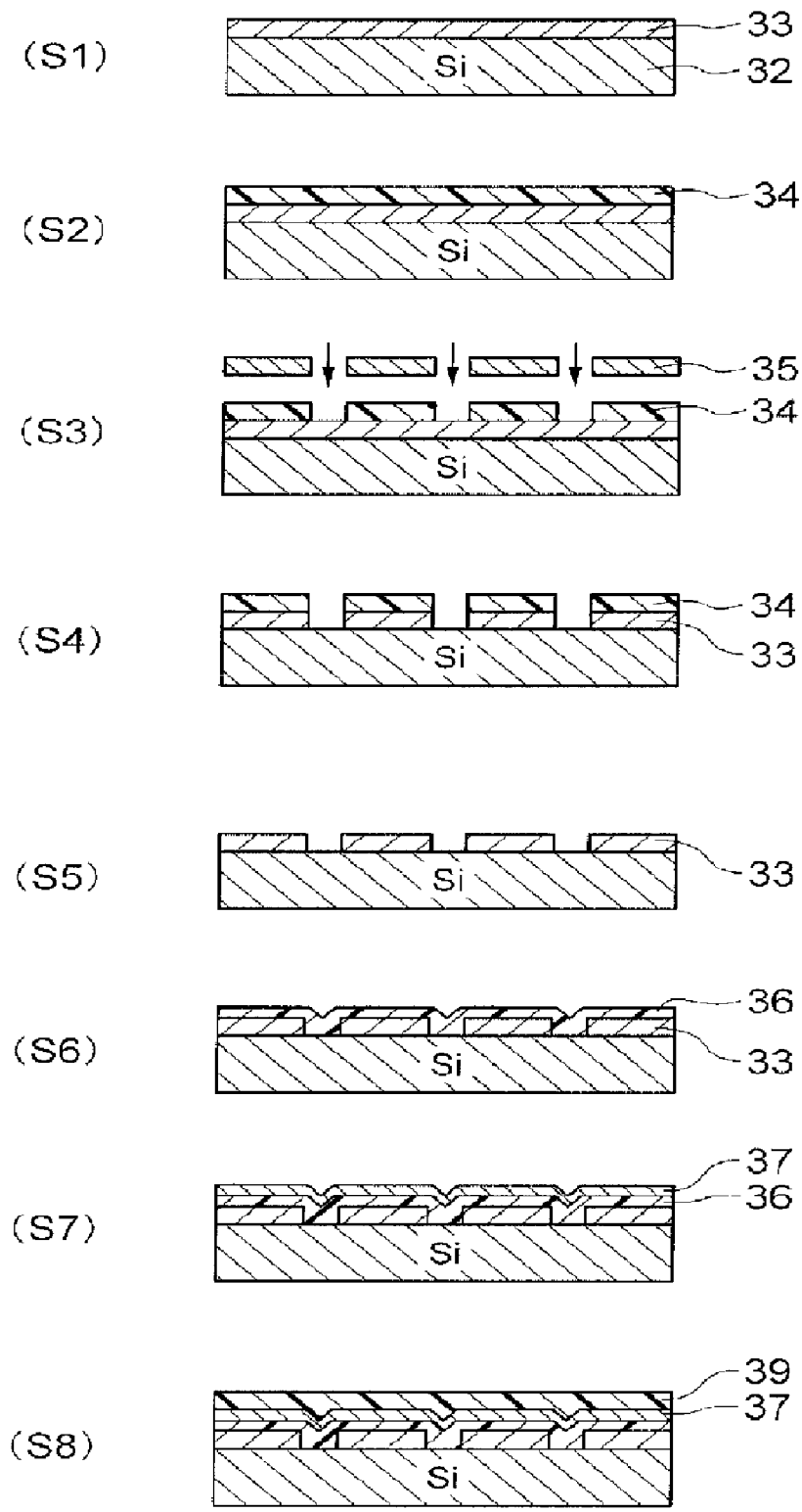
FIG. 6 is a process diagram showing a process of forming a hydrophilic film and a hydrophobic film on a carrier substrate of the present invention.
Figure 7:
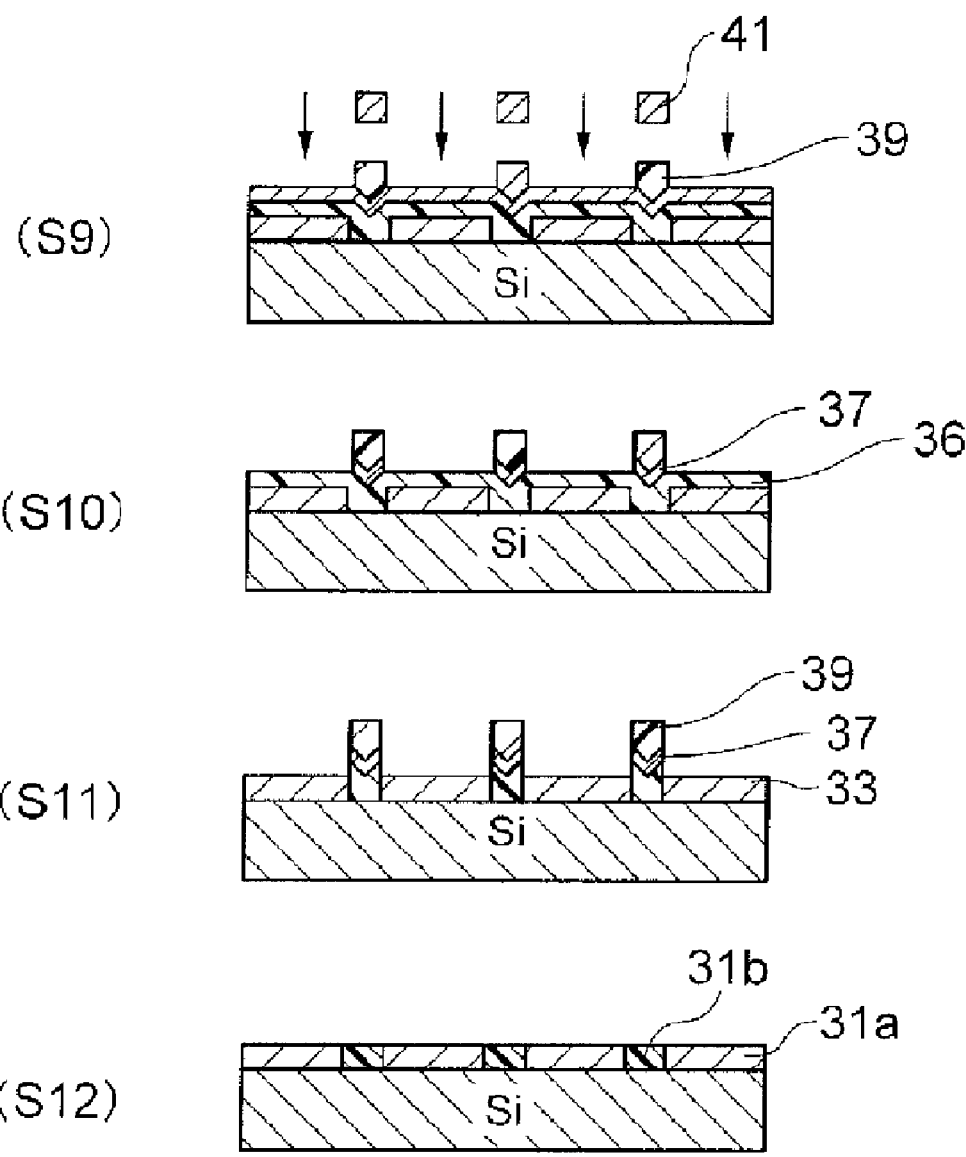
FIG. 7 is a process diagram showing a process of forming a hydrophilic film and a hydrophobic film on a carrier substrate of the present invention.

FIG. 6 shows an example of a process of forming a hydrophilic film 31a and a hydrophobic film 31b on a carrier substrate 31. A $SiO_2$ film 33 may be formed on a silicon substrate 32 (S1). The $SiO_2$ film 33 may be formed by a well-known method such as a thermal oxidation method, a CVD (Chemical Vapor Deposition) method, or a sputtering method. Then, the $SiO_2$ film 33 may be coated with photoresist 34 which is photosensitive resin (S2). Thereafter, the silicon substrate 32 coated with the photoresist 34 may be provided in an exposure device and a mask pattern 35 may be transcribed thereon. The exposed photoresist 34 may be developed (S3). Subsequently, the $SiO_2$ film 33 may be etched by using the developed photoresist pattern 34 (S4). In step S4, either one of a dry etching process or a wet etching process may be performed. If the photoresist 34 is removed, the $SiO_2$ film 33 on which the pattern corresponding to a temporary attachment area is formed can be obtained (S5). Then, a hydrophobic film 36 may be formed on a front surface of the $SiO_2$ film 33 (S6). The hydrophobic film 36 may be formed by dropping a liquid hydrophobic material onto the silicon substrate 32 and rotating the silicon substrate 32 at high speed by using a spin coater in the same manner as the photoresist 34. Thereafter, a hard mask 37 may be deposited on the hydrophobic film 36 (S7). The hydrophobic film 36 may be dissolved by exposure/development processes in the same manner as the photoresist 34. In order to prevent the hydrophobic film 36 from being dissolved, the hard mask 37 may be deposited. Subsequently, the hard mask 37 may be coated with photoresist 39 (S8). Then, as depicted in FIG. 7, the exposure/development processes may be performed on the photoresist 39 by using a mask pattern 41 (S9). Thereafter, the hard mask 37 may be etched (S10). Subsequently, the hydrophobic film 36 on the $SiO_2$ film 33 may be etched (S11). An incineration process (asking process) may be performed on the hydrophobic film 36 with oxygen plasma. Finally, the hard mask 37 may be removed by peeling the photoresist 39 (S12).

Through the above-described processes, the frame-shaped hydrophobic film 31b can be formed around the rectangle-shaped hydrophilic film 31a. By forming the hydrophobic film 31b around the hydrophilic film 31a, the hydrophilic area can be sharply distinguished from the hydrophobic area, and an edge of the hydrophilic area can be clearly defined. For this reason, positioning of a chip 20 by using the surface tension of water can be performed with high accuracy.

Alternatively, after the $SiO_2$ film 33 is formed on the silicon substrate 32, the hydrophobic film 36 may be formed on the $SiO_2$ film 33 and only the hydrophobic film 36 may be patterned. In this case, there may be a slight step-shaped portion between the $SiO_2$ film 33 and the hydrophobic film 36, and, thus, the hydrophobic film 36 may be slightly higher than the $SiO_2$ film 33.

Further alternatively, the hydrophobic film 36 may be formed by a lift-off method. That is, in step S4 of FIG. 6, after the $SiO_2$ film 33 is etched, the photoresist 34 may not be removed and instead, the hydrophobic film 36 may be formed on the photoresist 34. Then, the photoresist 34 may be dissolved by a developing solution. As a result, the photoresist 34 and the hydrophobic film 36 formed on the photoresist 34 can be removed at the same time.

Still further alternatively, a carrier substrate 31 may be made of a hydrophobic material such as single-crystalline silicon and only a hydrophilic film may be formed on a surface of the hydrophobic material.

Figure 8:
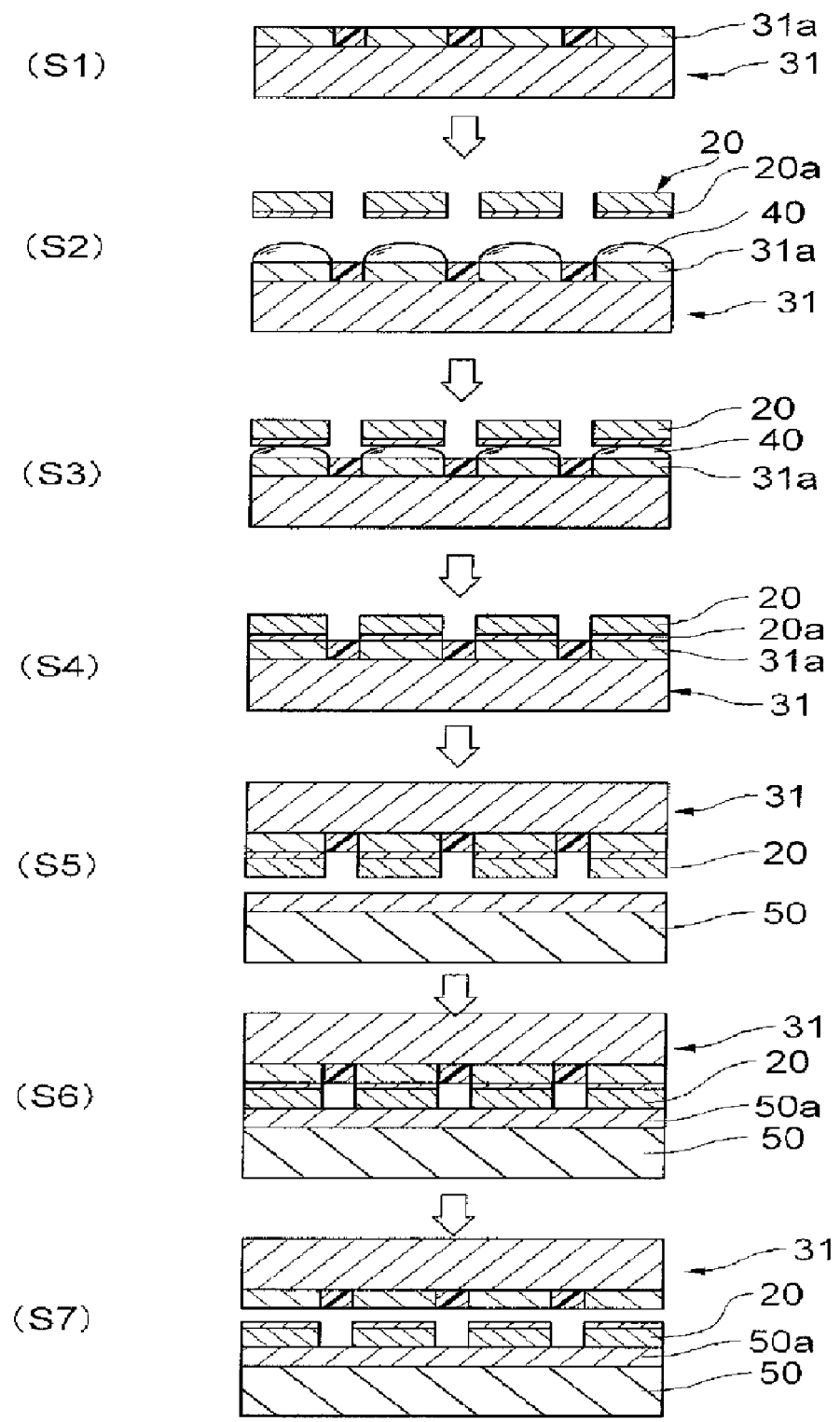
FIG. 8 is a process diagram showing a method of manufacturing a three-dimensional integrated circuit of the present invention.

There will be explained a process of positioning numerous chips on a carrier substrate 31. As depicted in FIG. 8, if multiple hydrophilic films 31a on a carrier substrate 31 are coated with water, water drops 40 may be formed on the multiple hydrophilic films 31a (S2).

As the process of coating the multiple hydrophilic films 31a with water, a contact method of bringing liquid into direct contact with the carrier substrate 31 or a spraying method of spraying water onto the carrier substrate 31 by using a nozzle may be employed. In the contact method, the carrier substrate 31 may be immersed into water in a vessel and then taken out of the vessel; the carrier substrate 31 may be downwardly brought into contact with water in a vessel and then picked up from the water; or water may flow on the carrier substrate 31. In the spraying method, at least one nozzle may be provided so as to face the carrier substrate 31 and water may be sprayed from the at least one nozzle toward the carrier substrate 31. The water may be sprayed from numerous nozzles toward the entire surface of the carrier substrate 31 or water may be sprayed from a nozzle(s) positioned so as to correspond to the hydrophilic film(s) 31a toward only the hydrophilic film(s) 31a. At this time, the amount of the water may be controlled depending on a surface area of the hydrophilic films 31a.

The optimum amount of water for positioning may vary depending on an area of the hydrophilic film 31a. Among multiple hydrophilic films 31a on the carrier substrate 31, a hydrophilic film 31a having a relatively large area may be coated with a relatively large amount of water and a hydrophilic film 31a having a relatively small area may be coated with a relatively small amount of water. In any one of the contact method and the spraying method, if it is needed to coat a surface of the carrier substrate 31 with water, an amount of water can be optimized automatically.

As depicted in FIG. 8, if a carrier substrate 31 is coated with water, water may spread throughout the entire surface of the hydrophilic film 31a and a water drop 40 may be formed on the entire surface of the hydrophilic film 31a. The water drop 40 may be formed in a convex shape by the surface tension of the water. The hydrophilic film 31a may be surrounded by a hydrophobic film 31b, and, thus, the water may not spread to the hydrophobic film 31b.

On a rear surface of a chip 20, a $SiO_2$ film 20a having a hydrophilic property may be formed in advance. Subsequently, multiple chips 20 may be released onto the water drops 40 divided by each hydrophilic film 31a (S3). Then, the chips 20 released onto the water drops 40 may be automatically positioned on the hydrophilic film 31a by the surface tension of the water. This process may be performed to each chip 20 by using, for example, a chip bonder or the multiple chips 20 may be released onto the water drops 40 at the same time by using a holding tray configured to hold all the chips 20 collectively.

Figure 9:
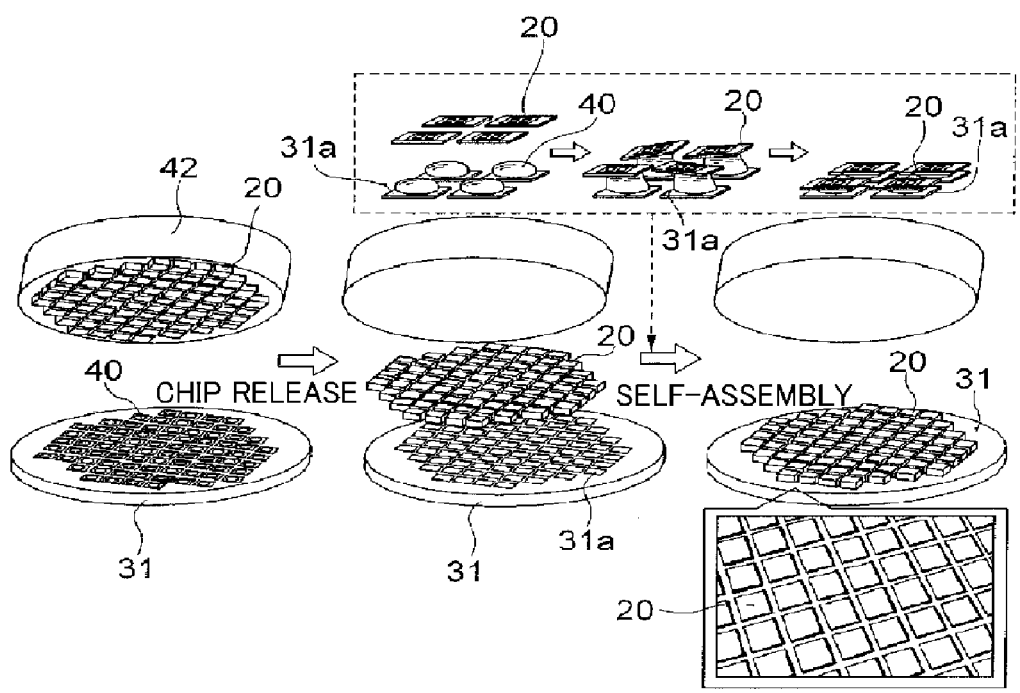
FIG. 9 shows a positioning process in case of using a whole holding tray.

FIG. 9 provides a schematic diagram in case of using a whole holding tray. If the multiple chips 20 are released onto multiple water drops 40 by using a whole holding tray 42, the chip 20 deviated in a horizontal direction with respect to the hydrophilic film 31a may be automatically positioned at an accurate position by the surface tension of water. When the chip 20 is released onto the water drop 40, it is not necessary to position the chip 20 at an accurate position on the hydrophilic film 31a and rough positioning may be sufficient.

Subsequently, as depicted in FIG. 8, water between a rear surface of the chip 20 and the hydrophilic film 31a of the carrier substrate 31 may be evaporated (S4). The water may be evaporated by heating or evaporated in a vacuum environment. Also, the water may be evaporated at room temperature for a certain time.

If the water is evaporated, the solid chip 20 and carrier substrate 31 may be attached to each other. The water may contain an additive that activates the $SiO_2$ film 20a of the chip 20 and the hydrophilic film 31a of the carrier substrate 31. In the present embodiment, hydrophilic groups (OH groups) may be formed in the $SiO_2$ film 20a of the chip 20 and the hydrophilic film 31a ($SiO_2$ film) of the carrier substrate 31 and the water may contain a hydrofluoric acid for combining these hydrophilic groups with each other. If the $SiO_2$ film 20a of the chip 20 and the hydrophilic film 31a of the carrier substrate 31 can be activated, the additive may not be limited to the hydrofluoric acid and may include ammonia and hydrochloric hydrogen peroxide mixed with hydrochloric acid, oxygenated water and water.

As a liquid having the surface tension for positioning, inorganic or organic liquids may be used instead of water. By way of example, glycerin, acetone, alcohol, and a SOG (Spin-On-Glass) material may be used. Otherwise, liquid resin or a mixture of liquid resin and water may be used. These liquids need to have a low viscosity sufficient for positioning.

If the multiple chips 20 are positioned on the carrier substrate 31, a transcription process in which the multiple chips 20 are transcribed from the carrier substrate 31 to a supporting substrate 50 may be performed. As depicted in FIG. 8, the carrier substrate 31 to which the multiple chips 20 are temporarily attached may be reversed and moved down toward the supporting substrate 50 (S5). Alternatively, without reversing the carrier substrate 31, the reversed supporting substrate 50 may be moved down toward the carrier substrate 31.

Thereafter, the multiple chips 20's surfaces opposite to the surfaces temporarily attached to the carrier substrate 31 may be collectively attached to a final attachment area 50a of the supporting substrate 50 (S6). If another chip 20 is stacked on the supporting substrate 50 in advance, the chip 20 may be attached to another chip 20 stacked on the supporting substrate 50. At this time, adhesive strength between the chip and the supporting substrate 50 (or stacked chip) may be controlled so as to be higher than adhesive strength between the chip 20 and the carrier substrate 31.

Subsequently, by moving the carrier substrate 31 away from the supporting substrate 50, the multiple chips 20 can be detached from the carrier substrate 31 while the multiple chips 20 are being attached to the supporting substrate 50 (S7). By repeating the above-described transcription process, the multiple chips 20 can be stacked on the supporting substrate 50 in a vertical direction. After the multiple chips are stacked on the supporting substrate 50, a three-dimensional integrated circuit may be obtained by performing a dicing process.

As the supporting substrate 50, a semiconductor wafer made of silicon or a glass substrate may be used. If it is strong enough to hold the multiple chips 20, an insulating member or a conductive member may be used as the supporting substrate 50. As the final attachment area 50a, a $SiO_2$ film may be formed on the supporting substrate 50.

Figure 10:
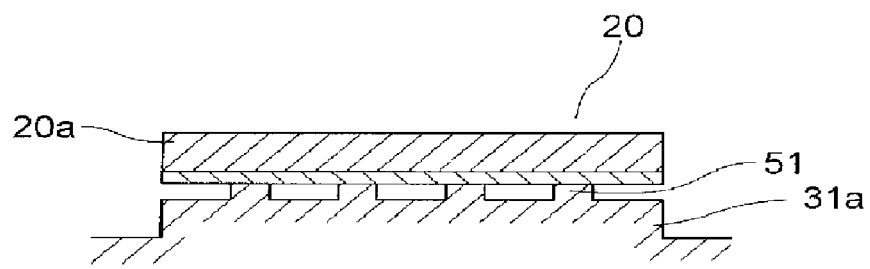
FIG. 10 shows an example of forming pillars on a hydrophilic film of a carrier substrate.

The following method can be used for setting the adhesive strength between the chip 20 and the carrier substrate 31 to be lower than the adhesive strength between the chip 20 and the supporting substrate 50. As depicted in FIG. 10, if a contact area between the hydrophilic film 31a ($SiO_2$ film) of the carrier substrate 31 and the $SiO_2$ film 20a of the chip 20 is smaller than a cross-sectional area of the chip 20 on a plane parallel to the hydrophilic film 31a, the adhesive strength between the chip 20 and the carrier substrate 31 can be decreased. If multiple pillars 51 are provided on the hydrophilic film 31a of the carrier substrate 31, the contact area between the chip 20 and the carrier substrate 31 can be decreased. The pillars 51 may be formed by a well-known lithography. Instead of the pillars 51, slight step-shaped portions may be formed on a front surface of the hydrophilic film 31a so as to decrease the contact area.

If surface roughness of the $SiO_2$ film of the supporting substrate 50 is smaller than surface roughness of the hydrophilic film 31a of the carrier substrate 31, the adhesive strength for final attachment can be higher than the adhesive strength for temporary attachment. If the surface roughness of the final attachment area 50a on the supporting substrate 50 is controlled to be, for example, about 1 nm or less by using a CMP (Chemical Mechanical Polishing) apparatus, the adhesive strength for final attachment can be sharply increased. Meanwhile, if the surface roughness of the hydrophilic film 31a of the carrier substrate 31 is set to be high, the adhesive strength for temporary attachment can be decreased. The $SiO_2$ film of the hydrophilic film 31a may become rough by a chemical method such as etching or by a mechanical method using a whetstone.

The hydrophilic film 31a of the carrier substrate 31 may be formed on a sacrificial layer that can be detached. When the chip 20 is detached from the carrier substrate 31, the chip 20 may be detached from the carrier substrate 31 with the sacrificial layer as a boundary while the hydrophilic film 31a of the carrier substrate 31 is being attached to the chip 20. As the sacrificial layer, resin which is dissolved by a liquid chemical or photoablation resin may be used.

For the final attachment between the chip 20 and the supporting substrate 50, the $SiO_2$ film 20a of the chip 20 may be attached to the $SiO_2$ film of the supporting substrate 50 as described above. Alternatively, an electrode (for example, a bump electrode) of the chip 20 may be attached to an electrode (for example, a bump electrode) of the supporting substrate 50. Further, a combination of these methods ($SiO_2$ film attachment and electrode attachment) may also be employed. If a dummy electrode is formed on the supporting substrate 50 in addition to the bump electrode, the adhesive strength for final attachment between the supporting substrate 50 and the chip 20 can be increased. By way of example, as a conductive material for the electrode, a double-layer structure (In/Au) of indium (In) and gold (Au), a double-layer structure (Sn/Ag) of tin (Sn) and silver (Ag), a single-layer structure of copper (Cu) or a single-layer structure of tungsten (W) may be appropriately used. If the bump electrodes are attached to each other, the pressure may be applied or the temperature may be increased.

For the final attachment between the chip 20 and the stacked chip, the $SiO_2$ film 20 of the chip 20 may be attached to a $SiO_2$ film of the stacked chip; and an electrode (for example, a bump electrode) of the chip 20 and an electrode (for example, a bump electrode) of the stacked chip may be attached to each other. Further, a combination of these methods (SiO$_2$ film attachment and electrode attachment) may be employed.

For the temporary attachment between the chip 20 and the carrier substrate 31, the SiO$_2$ film 20a of the chip 20 may be attached to the hydrophilic film 31a (SiO$_2$ film) of the carrier substrate 31 as described above. Alternatively, an electrode (for example, a bump electrode) of the chip 20 may be attached to an electrode (for example, a bump electrode) of the carrier substrate 31. Further, a combination of these methods (SiO$_2$ film attachment and electrode attachment) may be employed.

Figure 11:
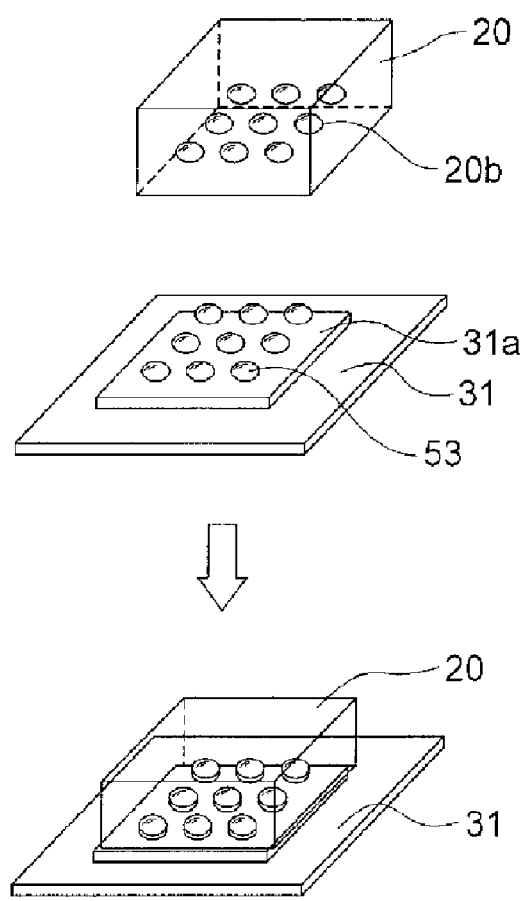
FIG. 11 shows an example of temporarily attaching bump electrodes of a chip to bump electrodes of a carrier substrate.
Figure 12:
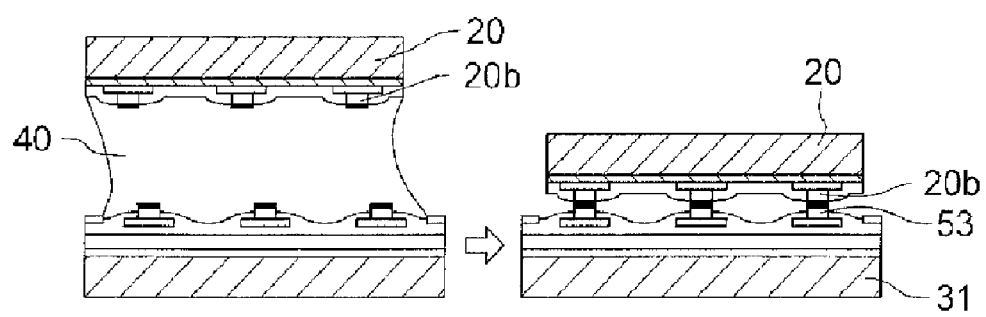
FIG. 12 shows an example of temporarily attaching bump electrodes of a chip to bump electrodes of a carrier substrate.

FIGS. 11 and 12 show an example of temporary attachment between a bump electrode 20b of a chip 20 and a bump electrode 53 on a hydrophilic film 31a of a carrier substrate 31. If water between the chip 20 and the carrier substrate 31 is evaporated and self-alignment is carried out, the bump electrode 20b of the chip 20 and the bump electrode 53 of the carrier substrate 31 can be positioned and it is possible to temporarily attach these bump electrodes 20b and 53 to each other.

Figure 13:
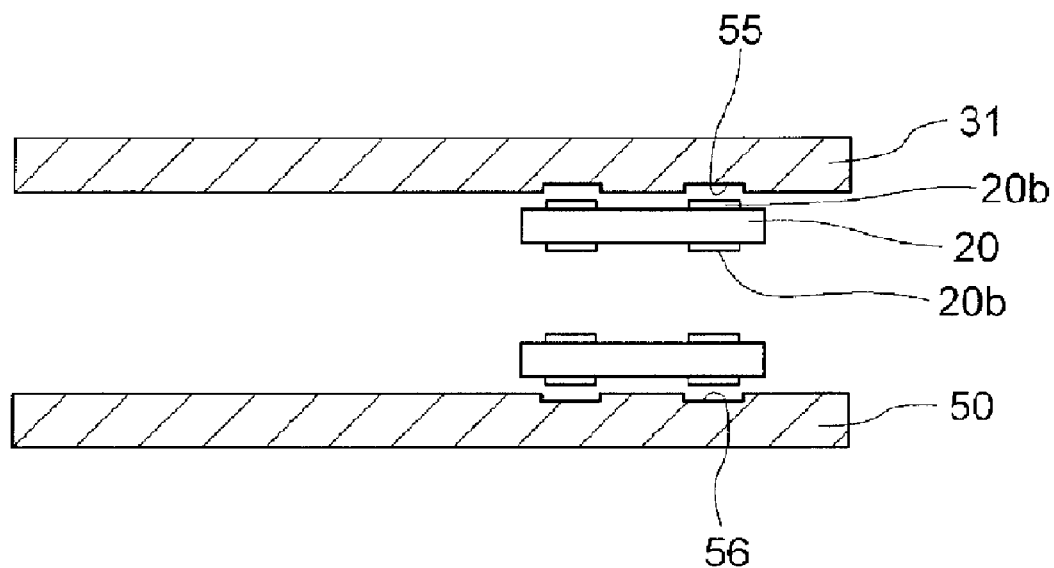
FIG. 13 shows an example of temporarily attaching a $SiO_2$ film of a carrier substrate to a $SiO_2$ film of a chip.

FIG. 13 shows an example of temporary attachment between a SiO$_2$ film of a carrier substrate 31 and a SiO$_2$ film of a chip 20. Even if a bump electrode 20b is formed on the chip 20, if a recess 55 corresponding to the bump electrode 20b is formed on the carrier substrate 31 in advance, the SiO$_2$ film of the carrier substrate 31 can be temporarily attached to the SiO$_2$ film of the chip 20. In the same manner, if a recess 56 corresponding to the bump electrode 20b of the chip 20 is formed on a supporting substrate 50 in advance, a SiO$_2$ film of the supporting substrate 50 can be finally attached to the SiO$_2$ film of the chip 20.

Figure 14:
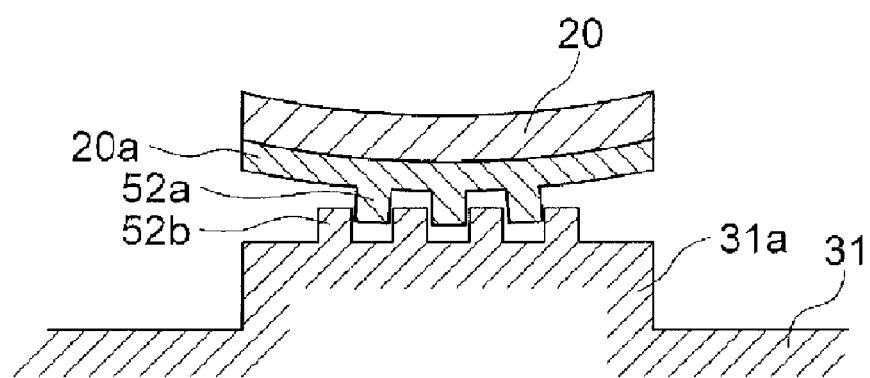
FIG. 14 shows an example of forming stoppers on a chip and a carrier substrate.

FIG. 14 shows an example in which stoppers 52a and 52b for engaging with each other are formed on a rear surface of a chip 20 and a hydrophilic film 31a of a carrier substrate 31. When a temporary attachment area between the chip 20 and the carrier substrate 31 is positioned by using the surface tension of water, if the chip 20 is bent, there is a concern that the chip 20 may not be positioned accurately on the hydrophilic film 31a. In accordance with this example, as water is evaporated, the stopper 52a of the chip 20 may be inserted into the stopper 52b of the carrier substrate 31. Therefore, the stoppers 52a and 52b may engage with each other so as to prevent the chip 20 from being deviated from its own position in a plane of the hydrophilic film 31a. Each cross section of the stoppers 52a and 52b may be formed into a rectangular shape or a tapered shape so as to determine a position of the chip 20 as the chip 20 approaches the carrier substrate 31. The stoppers 52a and 52b may be formed by a well-known lithography.

Figure 15:
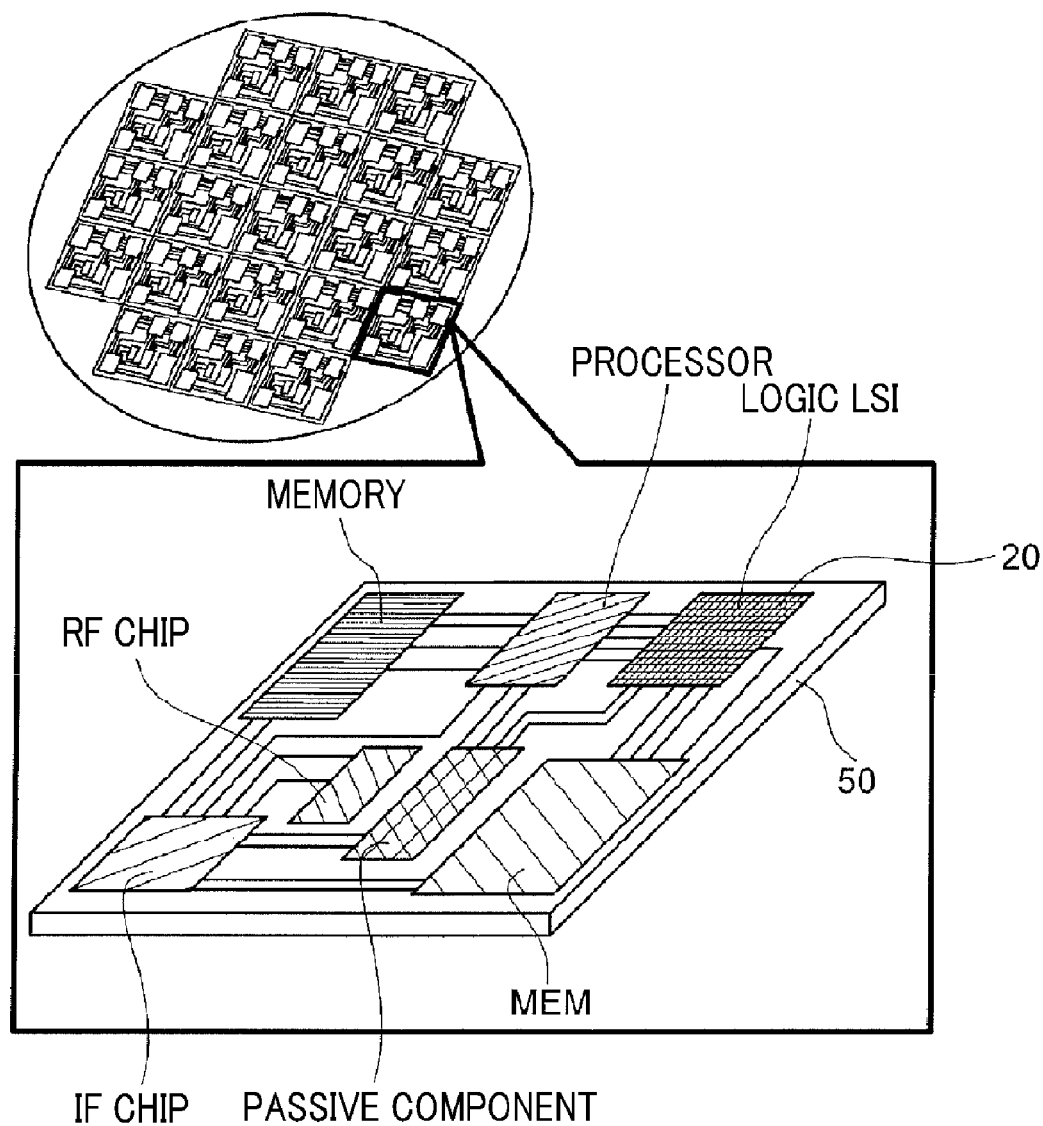
FIG. 15 is a perspective view showing an example of arranging a single-layer chip on a supporting substrate.

FIG. 15 shows an example of arranging a single-layer chip 20 on a supporting substrate 50. Each chip 20 may serve as a processor, a logic circuit or a memory. In this example, multiple chips 20 may be arranged on a plane of the supporting substrate 50 but may not be stacked in a vertical direction. A single-layer chip 20 may be arranged on the supporting substrate 50 in the same manner as the present example.

The present invention is not limited to the above-described embodiments, and can be modified and changed in various ways as long as technical conception and essential features of the present invention remain unchanged. By way of example, instead of forming a SiO$_2$ film on a surface of a carrier substrate by lithography, a SiO$_2$ film may be formed by performing an oxidation process on a silicon substrate. As the oxidation process, a H$_2$O$_2$ process or an oxidation process using ozone may be employed. Without performing the oxidation process on the silicon substrate, a SiO$_2$ film may be formed by natural oxidation.

After a chip is positioned at a temporary attachment area of a carrier substrate and temporarily attached thereto, the chip may be pressed onto the carrier substrate with a pressing plate. With the pressing plate, even if the chip is bent, the entire surface of the chip can be temporarily attached to the carrier substrate.

When a chip is stacked on a stacked chip of a supporting substrate, an electrically insulating adhesive may be provided between the chip and the stacked chip, and the chip and the stacked chip may be attached to each other by the electrically insulating adhesive.

After a chip is attached to a supporting substrate, a bump electrode may be formed on the chip. Further, a chip on which a bump electrode is formed in advance may be stacked on a supporting substrate.

The present specification is based on Japanese Patent Application No. 2009-070769 filed on Mar. 23, 2009. The entire disclosure of which is incorporated herein.

EXPLANATION OF CODES

20: Chip
20a: SiO$_2$ film of chip
31: Carrier substrate (Transcription substrate)
31a: Hydrophilic film (Temporary attachment area)
31b: Hydrophobic film
40: Water drop
50: Supporting substrate
50a: Final attachment area
51: Pillars
52a, 52b: Stoppers

What is claimed is:

1. A method for manufacturing a three-dimensional integrated circuit by stacking a chip on a supporting substrate, the method comprising:
coating a plurality of temporary attachment areas formed on a transcription substrate with a liquid;
releasing a plurality of chips onto a plurality of liquid drops divided by each of the temporary attachment areas and positioning each of the chips at each of the temporary attachment areas by using surface tension of the liquid;
temporarily attaching each of the chips to each of the temporary attachment areas by evaporating the liquid between each of the chips and each of the temporary attachment areas;
moving the transcription substrate to which the chips are temporarily attached toward the supporting substrate, and finally attaching the chips' surfaces opposite to surfaces temporarily attached to the transcription substrate to a plurality of final attachment areas of the supporting substrate or to a plurality of stacked chips on the final attachment areas such that adhesive strength between each of the chips and the supporting substrate or between each of the chips and each of the stacked chips on the supporting substrate is greater than adhesive strength between each of the chips and the transcription substrate; and
detaching the chips from the transcription substrate by moving the transcription substrate away from the supporting substrate while the chips are attached to the supporting substrate or the stacked chips on the supporting substrate.

2. The method for manufacturing a three-dimensional integrated circuit of claim 1, wherein the liquid contains an additive that temporarily attaches each of the chips to each of the temporary attachment areas when the liquid is evaporated.

3. The method for manufacturing a three-dimensional integrated circuit of claim 2, wherein $SiO_2$ films are formed on each of the temporary attachment areas of the transcription substrate and on a surface of each of the chips to be temporarily attached to the transcription substrate, and the additive attaches the $SiO_2$ films to each other.

4. The method for manufacturing a three-dimensional integrated circuit of claim 3, wherein a contact area between the $SiO_2$ film on each of the temporary attachment areas of the transcription substrate and the $SiO_2$ film on each of the chips is smaller than a cross-sectional area of each of the chips on a plane parallel to each of the temporary attachment areas.

5. The method for manufacturing a three-dimensional integrated circuit of claim 3, wherein surface roughness of a $SiO_2$ film on the supporting substrate is smaller than that of the $SiO_2$ film on each of the temporary attachment areas of the transcription substrate.

6. The method for manufacturing a three-dimensional integrated circuit of claim 3, wherein the $SiO_2$ film on each of the temporary attachment areas of the transcription substrate is formed via a sacrificial layer that can be detached, and in detaching the chips from the transcription substrate, the chips are detached from the transcription substrate while the $SiO_2$ film on each of the temporary attachment areas of the transcription substrate is attached to each of the chips.

7. The method for manufacturing a three-dimensional integrated circuit of claim 1, wherein on the transcription substrate, a lyophilic film that defines the temporary attachment area and has a lyophilic property with respect to the liquid is formed, and a lyophobic film that surrounds the temporary attachment area and has a lyophobic property with respect to the liquid is formed.

8. The method for manufacturing a three-dimensional integrated circuit of claim 1, wherein among the temporary attachment areas on the transcription substrate, a temporary attachment area having a relatively small area is coated with a relatively small amount of liquid drops, and a temporary attachment area having a relatively large area is coated with a relatively large amount of liquid drops.

9. The method for manufacturing a three-dimensional integrated circuit of claim 1, wherein, in coating the temporary attachment areas formed on the transcription substrate with the liquid, the liquid is brought into direct contact with the transcription substrate or the liquid is sprayed onto the transcription substrate by using a nozzle, so that the temporary attachment areas are coated with the liquid drops.

10. The method for manufacturing a three-dimensional integrated circuit of claim 1, wherein stoppers configured to engage with each other are formed on each of the temporary attachment areas of the transcription substrate and each of the chips, and when each of the chips is positioned at each of the temporary attachment areas by the surface tension of the liquid, the stoppers are engaged with each other to prevent each of the chips from being deviated from its own position in a plane of each of the temporary attachment areas.

11. An apparatus for manufacturing a three-dimensional integrated circuit by stacking a chip on a supporting substrate, the apparatus comprising:

a transcription substrate on which a plurality of temporary attachment areas are formed; and a liquid coating device for coating the temporary attachment areas formed on the transcription substrate with a liquid, wherein a plurality of chips are released onto a plurality of liquid drops divided by each of the temporary attachment areas and each of the chips is positioned at each of the temporary attachment areas by surface tension of the liquid, each of the chips is temporarily attached to each of the temporary attachment areas by evaporating the liquid between each of the chips and each of the temporary attachment areas, the transcription substrate to which the chips are temporarily attached is moved toward the supporting substrate, and the chips' surfaces opposite to surfaces temporarily attached to the transcription substrate are finally attached to a plurality of final attachment areas of the supporting substrate or a plurality of stacked chips on the final attachment areas such that adhesive strength between each of the chips and the supporting substrate or between each of the chips and each of the stacked chips on the supporting substrate is greater than adhesive strength between each of the chips and the transcription substrate, and the chips are detached from the transcription substrate by moving the transcription substrate away from the supporting substrate while the chips are attached to the supporting substrate or the stacked chips on the supporting substrate.

* * * * *

UNITED STATES PATENT AND TRADEMARK OFFICE
CERTIFICATE OF CORRECTION

PATENT NO. : 8,349,652 B2  
APPLICATION NO. : 13/258664  
DATED : January 8, 2013  
INVENTOR(S) : Mitsumasa Koyanagi et al.

Page 1 of 1

It is certified that error appears in the above-identified patent and that said Letters Patent is hereby corrected as shown below:

In the specification, column 7 line 53, FIG 6, please delete "asking" and insert --ashing--.

In the specification, column 9 line 52, FIG 9, please add --20-- after the word "chip".

Signed and Sealed this  
Fourteenth Day of May, 2013

Teresa Stanek Rea  
*Acting Director of the United States Patent and Trademark Office*